United States Patent [19]
Kuroda

[11] Patent Number: 4,535,471
[45] Date of Patent: Aug. 13, 1985

[54] COMPRESSION/EXPANSION DEVICE

[75] Inventor: Kazuo Kuroda, Saitama, Japan

[73] Assignee: Pioneer Electronic Corporation, Tokyo, Japan

[21] Appl. No.: 526,843

[22] Filed: Aug. 26, 1983

[30] Foreign Application Priority Data

Aug. 27, 1982 [JP] Japan ............... 57-129585[U]

[51] Int. Cl.³ .................... H03G 7/00; H04H 5/00
[52] U.S. Cl. ........................ 381/2; 381/106; 370/7; 455/72
[58] Field of Search ............ 381/2, 13, 1 C, 106, 381/107; 370/7; 455/72; 333/14

[56] References Cited

U.S. PATENT DOCUMENTS

| | | | |
|---|---|---|---|
| 3,775,705 | 11/1973 | Dolby | 381/106 |
| 3,978,409 | 8/1976 | Dolby et al. | 370/7 |
| 4,281,217 | 7/1981 | Dolby | 381/2 |
| 4,430,754 | 2/1984 | Ishigaki | 455/72 |

Primary Examiner—Forester W. Isen
Attorney, Agent, or Firm—Sughrue, Mion, Zinn, Macpeak, and Seas

[57] ABSTRACT

A compression/expansion device is adapted to compress and expand gains of additive and subtractive signals at each level of at least two audio signals, characterized in that each audio signal or any one of the additive and subtractive signals is compressed at the compressing side and expanded at the expanding side depending on the level of the additive signal.

9 Claims, 5 Drawing Figures

COMPRESSION/EXPANSION DEVICE

FIELD OF THE INVENTION

The present invention relates to a compression/expansion deivce for use in an FM stereo transmitting/receiving apparatus or a recording/reproducing apparatus in which a stereo audio signal is recorded and reproduced by means of a recording medium such as a video disc.

BACKGROUND OF THE INVENTION

Heretofore, as illustrated in FIG. 1, a compressor 1 and an expander 2 have been provided in a compression side, i.e., a transmitting side, and in an expansion side, i.e., a receiving side, respectively. The compressor 1 comprises variable gain amplifiers (VCA) 3 and 4, a peak detector OR circuit 5, and a time constant circuit 6. The peak detector OR circuit 5 is connected to the output end of each of the VCAs 3 and 4, and is used to detect which one of the output levels of VCAs 3 and 4 is greater, and then supplies the detected greater level through the time constant circuit 6 to the gain-controlling end of each of the VCAs 3 and 4. A transmitter 8 is connected through a matrix circuit 7 to the output ends of the compressor 1, i.e., the output ends of VCAs 3 and 4.

Similarly to the compressor 1, an expander 2 comprises VCAs 9 and 10, a peak detector OR circuit 11, and a time constant circuit 12. The peak detector OR circuit 11 is connected to the input end of each of th VCAs 9 and 10 so that the greater level detected by the peak detector OR circuit 11 is supplied through the time constant circuit 12 to the gain-controlling ends of VCAs 9 and 10. To the input ends of expander 2, i.e., the input ends of VCAs 9 and 10, a receiver 14 is connected through a matrix circuit 13. The receiver 14 is used for receiving an output signal from the transmitter 8 through an antenna or a transmission line (dotted lines A and B).

Assume that, in the above-described construction, an L signal is supplied to an input end $IN_1$ of the compressor 1 and an R signal is supplied to an input end $IN_2$. L and R signals are audio signals having a specific relationship therebetween. The L and R signals are compressed by VCA 3 and VCA 4, respectively, and then supplied to the matrix circuit 7. The matrix circuit 7 generates an (L+R) signal resulting from the addition of the L and R signals, and an (L−R) signal resulting from the subtraction of the L and R signals, and the additive and substractive signals are then transmitted by means of the transmitter 8. Transmission of the additive and subtractive signals is performed so that, even if stereo broadcasting is received with a stereo receiver or a monophonic receiver, compatibility is obtained in connection with the program contents. In the monophonic receiver, only the additive signal is processed. In the stereo receiver the additive and subtractive signals received by the receiver 14 are demodulated to the L and R signals in the matrix circuit 13. The L signal is expanded by VCA 9 ad supplied to an output end $OUT_1$, and the R signal is expanded by VCA 10 and supplied to an output end $OUT_2$. When the compression rate of the compressor 1 and the expansion rate of the expander 2 are indicated as, Y and Y' respectively, and compression/expansion is performed such that $Y \cdot Y' = 1$, L and R signals having nearly the same characteristics as the L and R signals at the transmission side can be demodulated at the receiving side. In this way the noise level resulting from the transmission system can be controlled. The time constant circuits 6 and 12 are provided so that natural audio feeling can be obtained at the receiving side.

FIG. 2 shows an expander placed in a monophonic receiver. In FIG. 2, VCA 15 is provided between an input end IN and an output end OUT. To the input end IN is connected a level-detecting circuit 16 with an output signal therefrom being supplied through a time constant circuit 17 to the gain-controlling end of VCA 15. In a monophonic receiver, as is well known, only an additive signal is supplied to the input end IN for processing. Thus, VCA 15 expands the additive signal according to the additive signal level.

In the case, however, in which two audio signals having correlation are each compressed at the transmission side and expanded at the receiving side, as in the above-described stereo transmitting/receiving apparatus, the compression or expansion operation has been conducted according to the larger level of each audio signal. However, when such stereo broadcasting is subjected to monophonic reproduction at the receiving side, the expansion operation is performed using only the additive signal, which results from the addition of the levels of the audio signals, and therefore the fidelity of the reproduced audio signals is inevitably reduced.

SUMMARY OF THE INVENTION

An object of the present invention is to provide a compression/expansion device which, even when a stereo audio signal comprising the additive and subtractive signals of two input signals is subjected to monophonic reproduction, the same fidelity as in stereo reproduction is obtained.

In the compression/expansion device of the present invention, each audio signal or any one of an additive signal and a subtractive signal is compressed at the compressing side and expanded at the expansion side, depending on the additive signal level.

The present invention relates to a compression/expansion device adapted to compress and expand gains of additive and subtractive signals corresponding to the sum and difference, respectively of at least two audio signals, characterized in that each audio signal or any one of the additive and subtractive signals is compressed at the compressing side and expanded at the expanding side depending on the level of the additive signal.

DETAILED DESCRIPTION OF THE INVENTION

The present invention will hereinafter be explained in detail by reference to the accompanying drawings.

Figure 1:
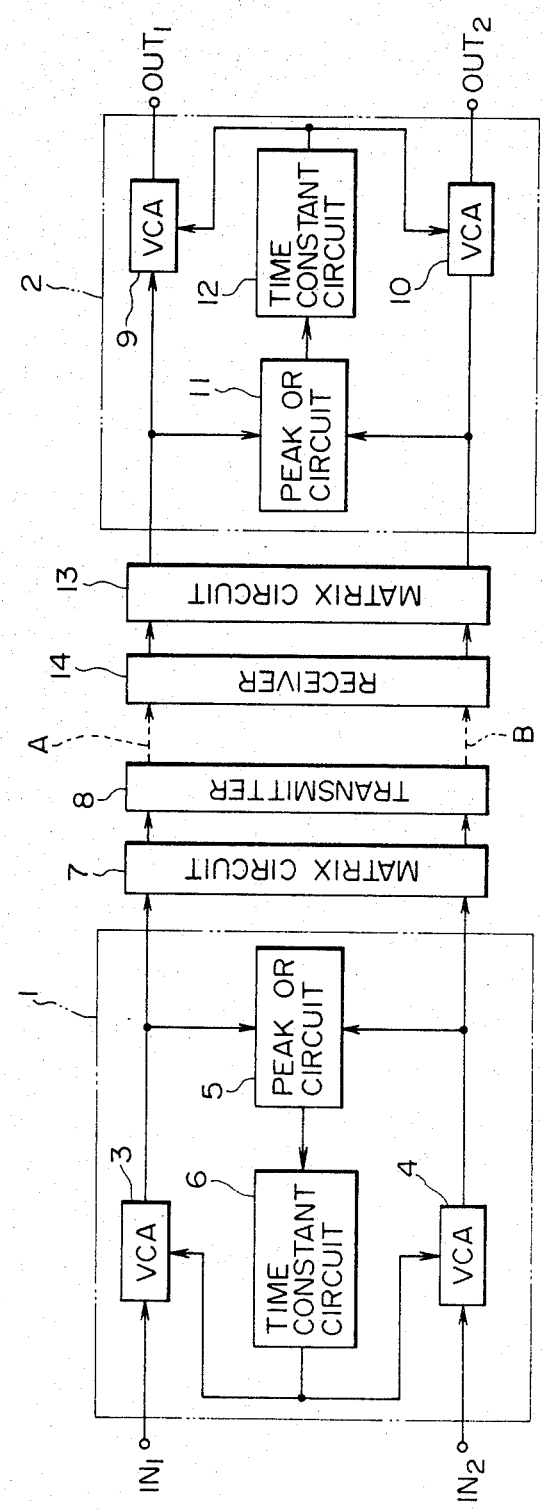
FIG. 1 is a block diagram showing a conventional compression/expansion device.
Figure 3:
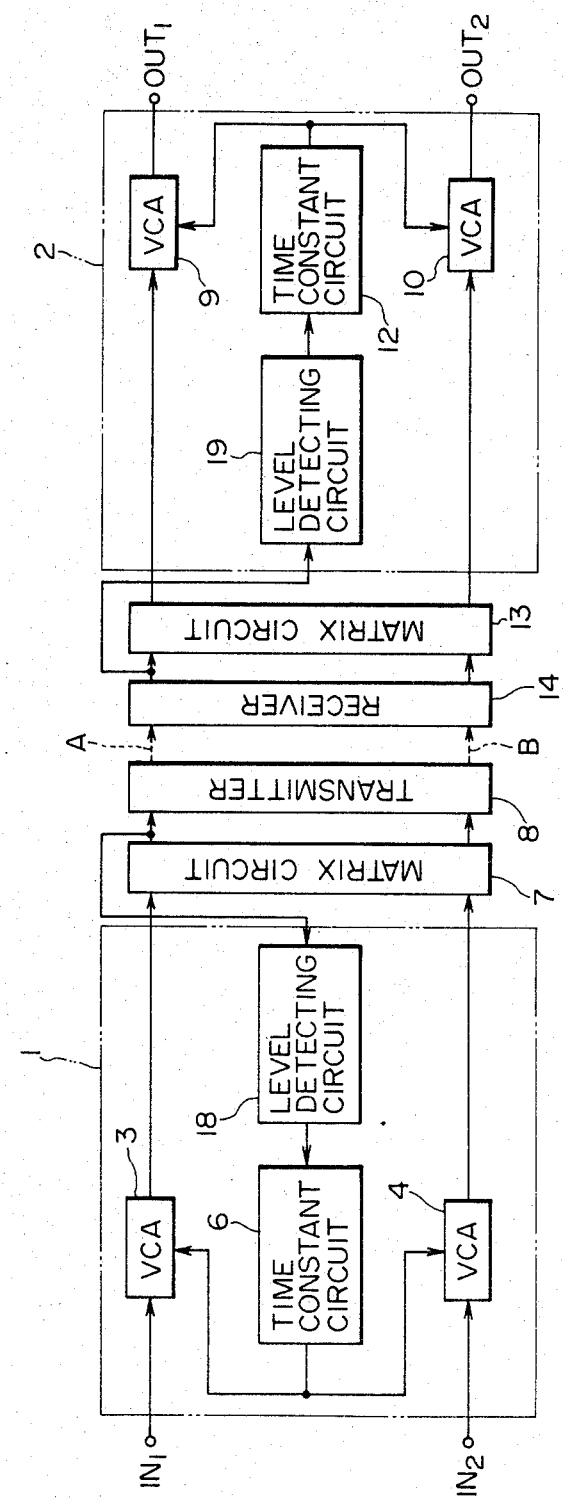
FIG. 3 is a block diagram showing an example of the invention.

FIG. 3 is a block diagram of a compression/expansion device of the present invention. In this drawing, the equivalent parts of the circuit of FIG. 1 are indicated by the same reference numerals. In a compressor 1, comprised of the same VCAs 3 and 4 and time constant circuit 6 as in the conventional compressor, a level-detecting circuit 18 to detect a peak level of the input signal is provided. The input end of the level-detecting circuit 18 is connected to one output end of a matrix circuit 7 so that an additive signal is supplied to the level-detecting circuit. The output end of the level-detecting circuit 18 is connected through a time constant circuit 6 to the gain-controlling ends of VCAs 3 and 4, so that the VCAs 3 and 4 operate depending on the peak level of the additive signal. Also in an expander 2, comprised of the same VCAs 9 and 10 and a time constant circuit 12 as in the conventional expander, a level-detecting circuit 19 is provided. The level-detecting circuit 19 is designed to detect the level of an additive signal from one input end of the matrix circuit 13 and to supply the thus-detected level through the time constant circuit 12 to the VCAs 9 and 10.

In the compression/expansion device of the present invention, having the construction as described above, when an L signal is supplied to the inlet end $IN_1$ and an R signal is supplied to the inlet end $IN_2$, an additive signal resulting from the addition of the L and R signals is generated at one output end of the matrix circuit 7, as in the conventional matrix circuit. The gains of VCAs 3 and 4 are controlled in a specific manner, depending on the additive signal level. That is, the compression rates of the L and R signals are controlled to predetermined levels by the VCAs 3 and 4. Similarly, at the receiving side, depending on the level of the additive signal supplied from receiver 14 to one input end of the matrix circuit 13, the gains of the VCAs 9 and 10 are controlled. That is, the expansion rates of the L and R signals are controlled to predetermined levels depending on the additive signal level by the VCAs 9 and 10.

Figure 2:
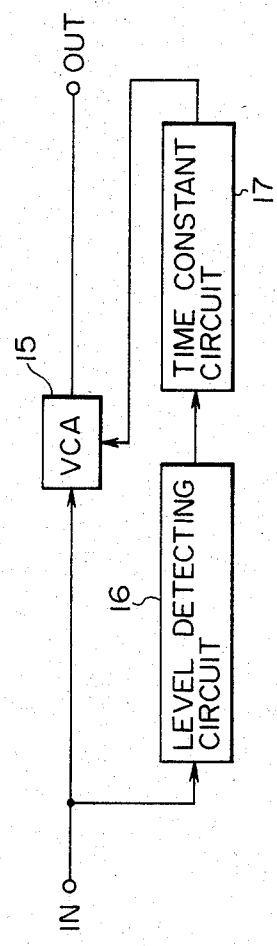
FIG. 2 is a block diagram showing an expansion apparatus of the monophonic receiver.

As a result, in a monophonic receiver an additive signal is expanded depending on the level of the additive signal. Therefore, even if the monophonic receiver receives a stereo signal from the transmitter 8, the same fidelity of reproduction of the audio signal as in the stereo reception/reproduction can be obtained, with no change in the circuit shown in FIG. 2.

Figure 4:
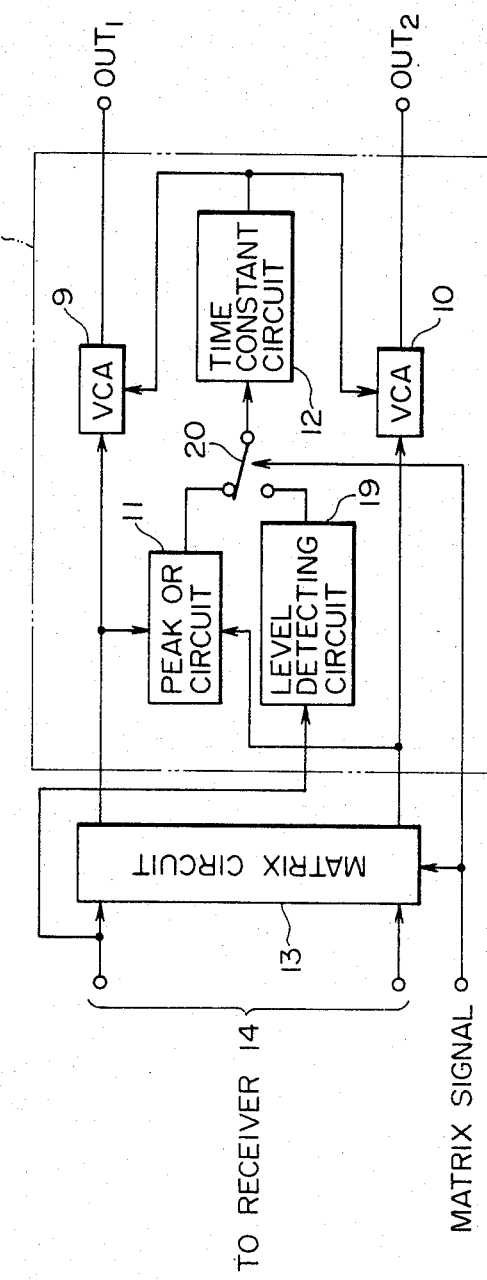
FIG. 4 is a block diagram showing another example of the invention.
Figure 5:
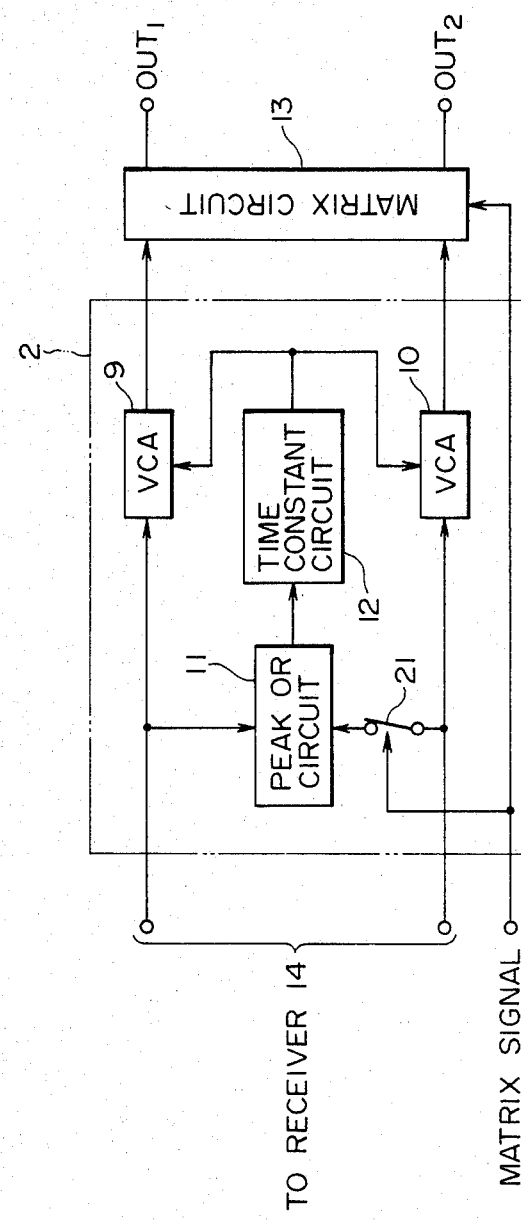
FIG. 5 is a block diagram showing another example of the invention.

FIGS. 4 and 5 each show only the receiving side of the other examples of the invention. In FIG. 4, a matrix circuit 13 operates according to a matrix signal, and when the matrix signal is supplied, the additive and subtractive signals (L and R signals) are supplied from the receiver 14 to the matrix circuit 13. A peak detector OR circuit 11 is connected to each output end of the matrix circuit 13, and a switch 20 is connected to the output ends of the peak detector OR circuit 11 and a level-detecting circuit 19. The switch 20 is arranged to supply an output signal from either the peak detector OR circuit 11 to the time constant circuit 12 when the matrix signal is not present, or from the level-detecting circuit 19 to the time constant circuit 12 when the matrix signal is present. Hence, when the matrix signal is present, for example, when receiving a stereo signal supplied from the stereo transmitter 8, the gains of the VCAs 9 and 10 vary depending on the level of the additive signal. When the matrix signal is not supplied, the gains of VCAs 9 and 10 are controlled depending on the greater signal level supplied from the receiver 14 to the VCAs 9 and 10 through the inactive matrix circuit 13.

In the circuit of FIG. 5, a matrix circuit 13 is connected to an output end of an expander 2, and an output signal of a receiver 14 is directly supplied to the expander 2. One input end of a peak detector OR circuit 11 is connected to an input end of VCA 9, and the other input end is connected to an input end of VCA 10 through a switch 21. The switch 21 is designed to be "OFF" when the matrix signal is present. Therefore, when the matrix signal is supplied, the additive signal is elongated by VCA 9 and the subtractive signal is elongated by VCA 10, according to the additive signal level. If the matrix signal is not present, then the switch 21 is "ON" and the VCAs 9 and 10 are controlled according to the greater signal level detected by the peak detector OR circuit 11.

As described above, the compression/expansion device of the present invention is so constructed that each audio signal or any one of the additive and subtractive signals is compressed at the compressing side and expanded at the expanding side, depending on the additive signal level. Therefore, even when such a transmission signal is received by a monophonic receiver, the same reproduction fidelity is obtained as in the case in which the signal is received by a stereo receiver. Although the the above explanation has been made with reference to the case of two channels of L and R signals, the device of the present invention is applicable to a four channel transmission apparatus in which two-language broadcasting is possible with the L or R signal as a level arm L+Y signal) of 1 and Y signals, or a level difference (1−Y signal) of 1 and Y signals.

Moreover, although a compression/expansion device for a stereo transmitting/receiving apparatus is explained in the above examples, the device of the present invention is applicable to a recording/reproducing apparatus for a stereo audio signal. In this case, it is apparent that the transmitter 8, receiver 14 and transmission lines A and B correspond to a recording unit, a reproducing unit, and an information recording medium, respectively.

I claim:

1. A compression/expansion device of the type for processing first and second audio signals and having means for generating an additive signal corresponding to the sum of said first and second audio signals and a subtractive signal corresponding to the difference between said first and second audio signals, said device comprising:
   compression means for compressing at least one of said first signal, said second signal, said additive signal and said subtractive signal in accordance with the level of said additive signal; and
   expansion means for expanding said at least one signal in accordance with the level of said additive signal.

2. A compression/expansion device as claimed in claim 1, wherein said compression means comprises detection means for detecting the level of said additive signal, a first amplifier for amplifying said first signal with a gain in accordance with said detected additive signal level and a second amplifier for amplifying said second signal with a gain in accordance with said detected additive signal level.

3. A compression/expansion device as claimed in claim 1 wherein said expansion means comprises detection means for detecting the level of said additive signal received from said compression means, a first amplifier for amplifying said first signal with a gain in accordance with said detected additive signal level and a second amplifier for amplifying said second signal with a gain in accordance with said detected additive signal level.

4. In a stereo signal processing system wherein at least first and second audio signals are combined in first combining means to obtain an additive signal corresponding to the sum of said first and second audio signals and a subtractive signal corresponding to the difference between said first and second audio signals, and wherein said first and second audio signals are later recovered by combining said additive and subtractive signals in a second combining means, a compression/expansion device comprising:
compression means for detecting the level of said additive signal and for compressing at least one of said first, second, additive and subtractive signals in accordance with said detected additive signal level; and
expansion means for detecting the level of said additive signal and for expanding said at least one signal in accordance with said detected additive signal level.

5. A stereo processing system as claimed in claim 4, wherein said compression means comprises:
first matrix means responsive to said first and second audio signals for providing additive and subtractive signal outputs;
a first amplifier for amplifying said first signal with a gain in accordance with said detected additive signal and providing the amplified first signal to said first matrix means;
a second amplifier for amplifying said second signal with a gain in accordance with said detected additive signal and providing the amplified second signal to said first matrix means; and
a level detecting circuit for detecting the level of said additive signal.

6. A stereo signal processing system as claimed in claim 4, wherein said expansion means comprises:
first matrix means for receiving additive and subtractive signal inputs and for providing first audio signal and second audio signal outputs;
a first amplifier for amplifying said first signal with a gain in accordance with the level of said received additive signal;
a second amplifier for amplifying said second signal with a gain in accordance with the level of said received additive signal; and
a level detecting circuit for detecting the level of said received additive signal.

7. A stereo signal processing system as claimed in claim 4, wherein said expansion means comprises:
first matrix means for receiving said additive and subtractive signals from said compression means, said first matrix means being responsive to a first state control signal for providing said first and second signals at its front and second outputs, respectively, and being responsive to a second state control signal for providing its inputs at its outputs;
a means of providing a monophonic status signal to said first matrix means as said control signal, said monophonic status signal having said first state when a stereo signal is being processed and a second state when a monophonic signal is being processed;
a peak detector OR circuit for receiving said first and second outputs of said first matrix means and providing a signal corresponding to the greater of said matrix means outputs as an OR output;
a level detecting circuit for detecting the level of said additive signal from the input of said first matrix means;
switching means switched in response to said monophonic status signal for selectively providing an output signal from said peak detector OR circuit when said monophonic status signal has said second state and from said level detecting circuit when said monophonic status signal has said first state;
a first amplifier for amplifying said first matrix means output with a gain in accordance with the output signal from said switch means; and
a second amplifier for amplifying said second matrix means output with a gain in accordance with the output of said switch means.

8. A stereo signal processing system as claimed in claim 4, wherein said expansion means has first and second inputs, said first input receiving said additive signal when a stereo signal is being processed and one of said first and second inputs receiving said additive signal when a monophonic signal is being processed, said expansion means further comprising:
means for providing a monophonic status signal having a first state when a stereo signal is being processed and a second state when a monophonic signal is being processed;
switch means having an input receiving said second expansion means input and selectively providing said second expansion means input to its output in response to said second state of said monophonic status signal;
a peak detector OR circuit having a first input coupled to said first input of said expansion means and a second input coupled to the output of said switch means and providing as an OR output a signal corresponding to the greater of its first and second inputs, whereby said OR output alwasy represents the level of said additive signal;
a first amplifier for amplifying said first expansion means input with a gain in ccordance with said OR output;
a second amplifier for amplifying said second expansion means input with a gain in accordance with said OR output; and
a first matrix means for demodulating signals received from said first and second amplifiers and for providing said first and second audio signal outputs.

9. A compression/expansion device comprising:
a first variable gain amplifier for receiving at its input a first audio signal and for generating a first compressed signal, wherein the gain of said first audio signal is compressed in response to a first control signal;
a second variable gain amplifier for receiving at its input a second audio signal and for generating a second compressed signal, wherein the gain of said second audio signal is compressed in response to said first control signal;
a first matrix circuit for receiving said first and second compressed signals from said first an second variable gain amplifiers and generating an additive signal output corresponding to the sum of said first and second compressed signals and a subtractive signal output corresponding to the difference between said first and second compressed signals;

a first level detecting circuit for receiving said additive signal output from said first matrix circuit and generating a first peak level signal;

a first time constant circuit for receiving said first peak level signal from said first level detecting circuit and generating said first control signal for application to said first and second variable gain amplifiers;

a transmitter for receiving said additive and subtractive signals from said matrix circuit and transmitting said additive and subtractive signals;

a receiver for receiving and outputting said transmitted additive and subtractive signals;

a second matrix circuit for receiving said additive and subtractive signals from said receiver and for demodulating said additive and subtractive signals into said first and second audio signals;

a third variable gain amplifier for receiving said demodulated first audio signal from said second matrix circuit, wherein the gain of said demodulated first audio signal is expanded and output as a first output signal in response to a second control signal;

a fourth variable gain amplifier for receiving said demodulated second audio signal from said second matrix circuit, wherein the gain of said demodulated second audio signal is expanded and output as a second output signal in response to said second control signal;

a second level detecting circuit for receiving said outputted additive signal from said receiver and generating a second peak level signal; and a second time constant circuit for receiving said second peak level signal from said second level detecting circuit and generating said second control signal for application to said third and fourth variable gain amplifiers.

* * * * *